US008029873B2

(12) United States Patent
Ikeda et al.

(10) Patent No.: US 8,029,873 B2
(45) Date of Patent: Oct. 4, 2011

(54) FILM DEPOSITION METHOD AND FILM DEPOSITION APPARATUS OF METAL FILM

(75) Inventors: Taro Ikeda, Nirasaki (JP); Yasushi Mizusawa, Albany, NY (US); Tatsuo Hatano, Nirasaki (JP); Osamu Yokoyama, Nirasaki (JP); Takashi Sakuma, Nirasaki (JP)

(73) Assignee: Tokyo Electron Limited, Minato-Ku, Tokyo-To (JP)

( * ) Notice: Subject to any disclaimer, the term of this patent is extended or adjusted under 35 U.S.C. 154(b) by 786 days.

(21) Appl. No.: 11/922,918

(22) PCT Filed: Jun. 28, 2006

(86) PCT No.: PCT/JP2006/312890
§ 371 (c)(1),
(2), (4) Date: Dec. 27, 2007

(87) PCT Pub. No.: WO2007/001022
PCT Pub. Date: Jan. 4, 2007

(65) Prior Publication Data
US 2009/0227104 A1   Sep. 10, 2009

(30) Foreign Application Priority Data

Jun. 28, 2005  (JP) ................................. 2005-188107
Sep. 26, 2005  (JP) ................................. 2005-277044

(51) Int. Cl.
*H05H 1/24* (2006.01)
*C23C 16/00* (2006.01)
(52) U.S. Cl. ...................... 427/569; 427/248.1; 427/250

(58) Field of Classification Search ............... 427/248.1, 427/569, 250
See application file for complete search history.

(56) References Cited

U.S. PATENT DOCUMENTS 5,968,327 A * 10/1999 Kobayashi et al. ...... 204/298.11
(Continued)

FOREIGN PATENT DOCUMENTS
JP      10-289887        10/1998
(Continued)

OTHER PUBLICATIONS

PCT Notification of Transmittal of Translation of the International Preliminary Examination Report (Form PCT/IB/338) dated Jan. 2004.

(Continued)

*Primary Examiner* — Kelly M. Gambetta
(74) *Attorney, Agent, or Firm* — Smith, Gambrell & Russell, LLP

(57) ABSTRACT

The present invention is a film deposition method of a metal film comprising the steps of: placing an object to be processed having a recess formed in a surface thereof, on a stage in a processing vessel; evacuating the processing vessel to create a vacuum therein; ionizing a metal target in the evacuated processing vessel to generate metal particles including metal ions, by means of a plasma formed by making the plasma from an inert gas; and by applying a bias electric power to the object to be processed placed on the stage to draw the plasma and the metal particles into the object to be processed, scraping a bottom part of the recess to form a scraped recess, and depositing a metal film on an entire surface of the object to be processed including surfaces in the recess and in the scraped recess.

9 Claims, 12 Drawing Sheets

U.S. PATENT DOCUMENTS 6,949,461 B2 9/2005 Malhotra et al.
2003/0075752 A1 4/2003 Motoyama

FOREIGN PATENT DOCUMENTS

| JP | 2000-077365 | | | 3/2000 |
|---|---|---|---|---|
| JP | 2003-124313 | | | 4/2003 |
| JP | 2003124313 | A | * | 4/2003 |
| JP | 2004-153162 | | * | 5/2004 |
| JP | 2004153162 | A | * | 5/2004 |
| WO | 2004/053926 | | | 6/2004 |

OTHER PUBLICATIONS

PCT International Preliminary Report on Patentability (Form PCT/IPEA/409) dated Apr. 2005.

* cited by examiner

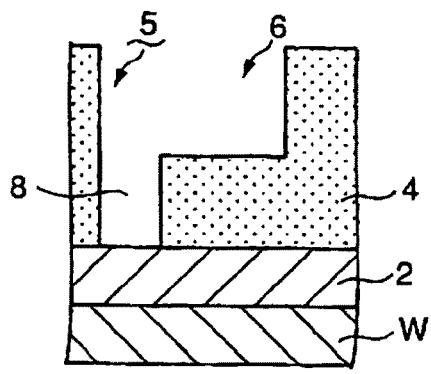
FIG. 5A
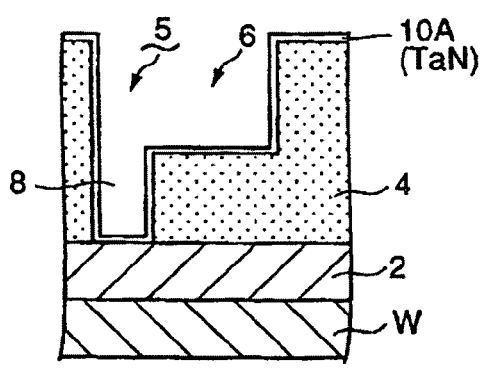
FIG. 5B
FIG. 5C
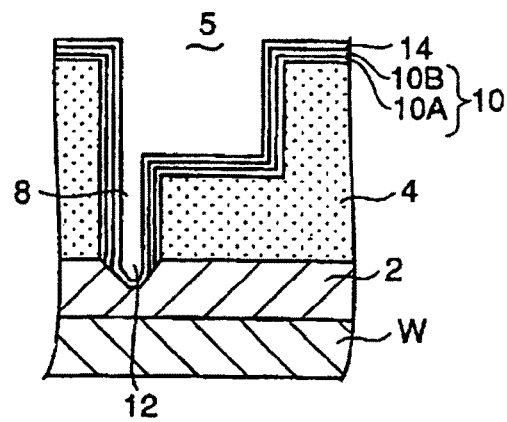
FIG. 5D
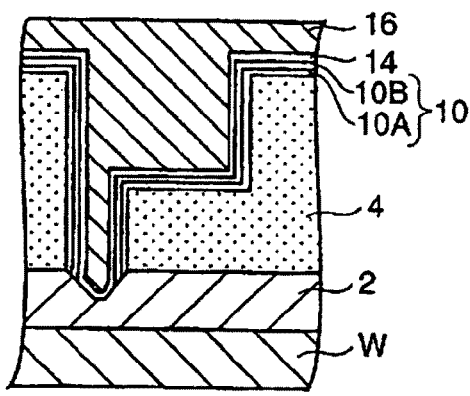
FIG. 5E
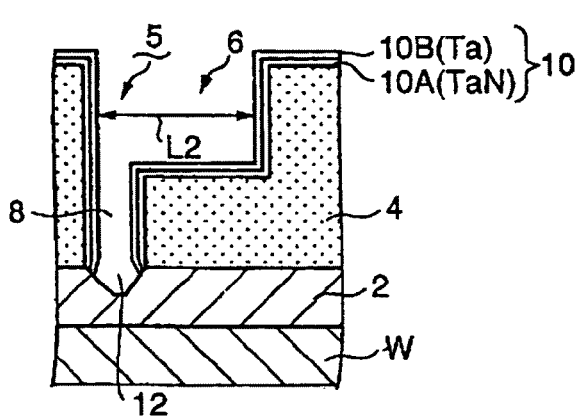
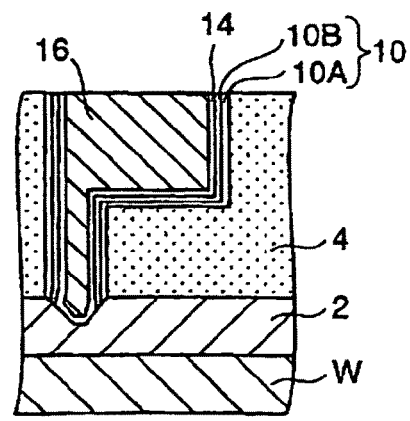
FIG. 5F ⟨CONVENTIONAL METHOD⟩          ⟨METHOD OF PRESENT INVENTION⟩
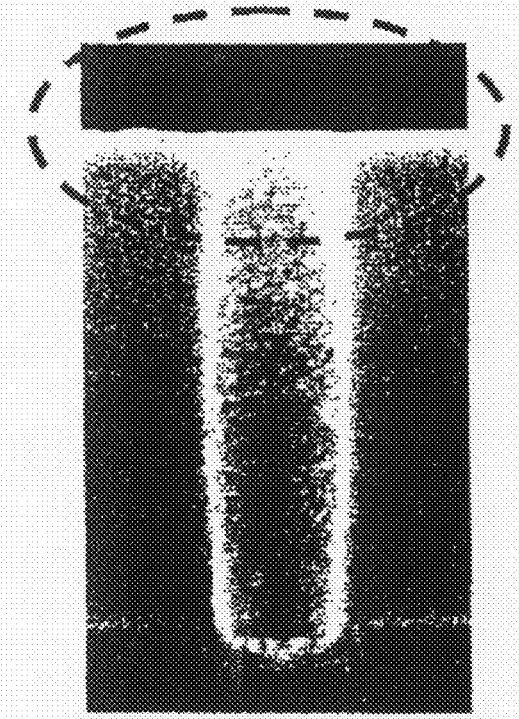
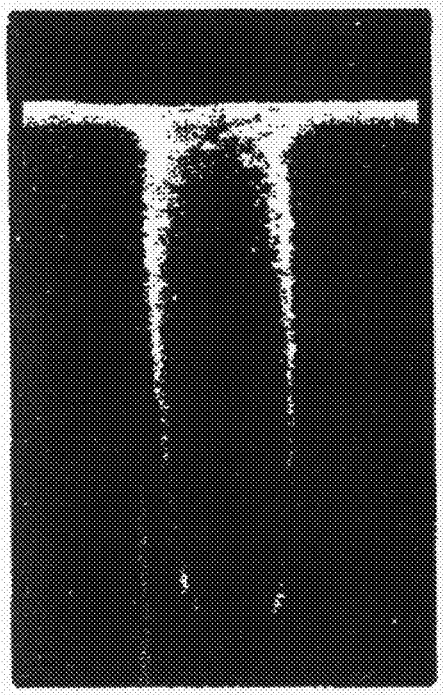
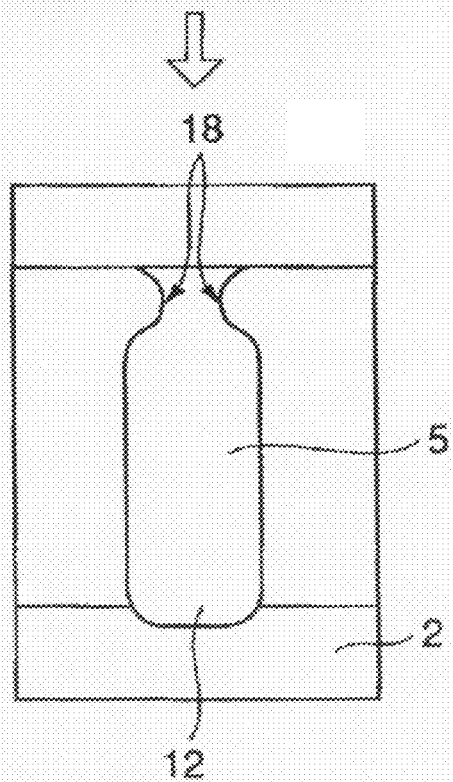
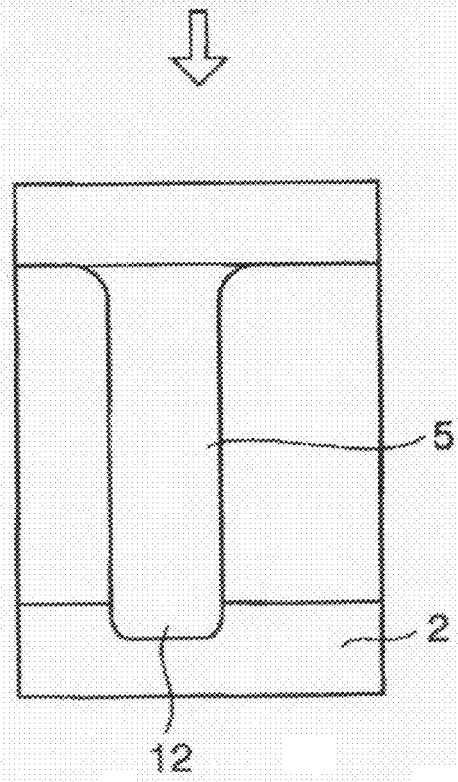
F I G. 6 A                F I G. 6 B

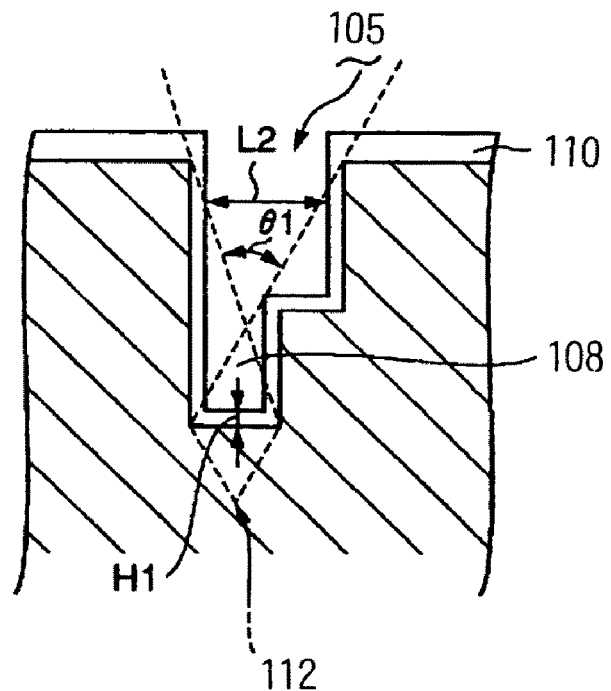
F I G. 1 4 A
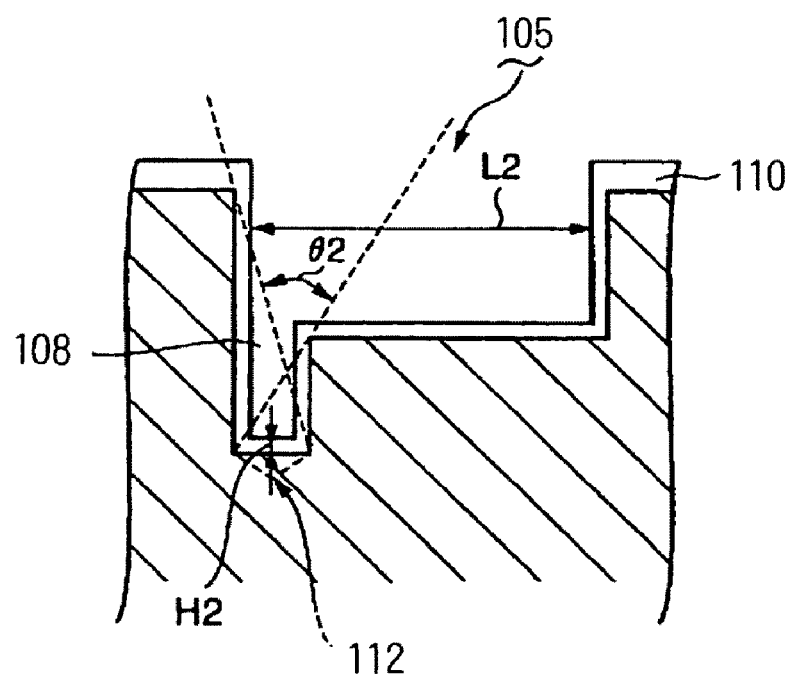
F I G. 1 4 B

FILM DEPOSITION METHOD AND FILM DEPOSITION APPARATUS OF METAL FILM

FIELD OF THE INVENTION

The present invention relates to a film deposition method and a film deposition apparatus, for effectively depositing a metal film on a surface of a recess formed in a surface of an object to be processed such as a semiconductor wafer.

BACKGROUND ART

When a semiconductor device is manufactured, generally, a semiconductor wafer is repeatedly subjected to various processes such as a film deposition process and a pattern etching process, so as to manufacture a desired device. In view of recent demand for higher integration degree and further miniaturization of a semiconductor device, a line width thereof and/or a hole diameter thereof have been made smaller and smaller. In accordance with such smaller dimensions, electric resistance has to be made smaller. Thus, there is a tendency to use copper as a wiring material and/or an embedded material, because copper has smaller electric resistivity and is inexpensive (see, JP-A-2000-77365). When copper is used as a wiring material and/or an embedded material, a tantalum metal (Ta) film or a tantalum nitride (TaN) film is used as a barrier layer in consideration of adhesive properties between the copper material and a lower layer thereof.

In order to form such a barrier layer, a tantalum nitride film (hereinafter also referred to as "TaN film") or a tantalum film (hereinafter also referred to as "Ta film") is formed at first as a base layer on a surface of a wafer in a plasma sputtering apparatus. Then, in the same plasma sputtering apparatus, an additional tantalum film is formed (when the base layer is a Ta film, the film deposition conditions are varied). Thus, a barrier layer is formed. Thereafter, a thin seed film made of a copper film is formed on a surface of the barrier layer, and the entire wafer surface is plated with copper to fill a recess.

A lower wiring layer and an upper wiring layer, which are stacked with an insulation film therebetween, are electrically connected in the following manner. Firstly, the insulation layer is formed on the lower wiring layer. Then, a communication hole, such as a via hole and a through hole, is formed in the insulation layer to expose the lower wiring layer at a bottom part of the communication hole. Thereafter, the communication hole is filled with a material of the upper wiring layer, and the upper wiring layer is deposited at the same time. As described above, since the line width is to be narrowed and the hole diameter is to be reduced in accordance with the demand for miniaturization, it is necessary to take measures to lower electric resistance in the connecting structure between the upper and lower wiring layers. As an example of the measures, the through hole is formed such that the bottom part thereof is "embedded" to a predetermined thickness of the lower wiring layer, so that contact resistance between an embedded material to be "embedded" in the bottom part of the through hole and the lower wiring layer is reduced. Such a structure is referred to as a so-called "punch-through structure". A method of forming this structure is referred to as a so-called "punch-through process".

An example of the punch-through process is described with reference to FIGS. 12A to 12C and FIGS. 13A to 13E. FIGS. 12A to 12C show a communication hole formed in a semiconductor wafer which is not yet filled. FIG. 12A is a plan view of the semiconductor wafer whose communication hole is not yet filled. FIG. 12B is a sectional view of the semiconductor wafer taken along the line A-A shown in FIG. 12A. FIG. 12C is a perspective view of the semiconductor wafer shown in FIG. 12A. FIGS. 13A to 13E are views for explaining a filling step of the communication hole.

As shown in FIGS. 12A to 12C, the semiconductor wafer W is formed of a silicon substrate, for example. A lower wiring layer 102 made of copper, and an insulation layer 104 formed of a silicon oxide film are stacked on a surface of the silicon substrate in this order. A recess 105 is formed in a surface of the insulation layer 104. The recess 105 has a wiring groove of a predetermined width, i.e., a trench 106, for forming an upper wiring layer. In a bottom part of the trench 106, there is partially formed a communication hole 108 which passes through the insulation layer 104 to reach the lower wiring layer 102. The communication hole 108 will function as a via hole or a through hole. A diameter L1 of the communication hole 108 is significantly small, e.g., between about 60 nm and about 200 nm. A width L2 of the trench 106 is, e.g., between about 60 nm and about 1000 nm.

In order that the communication hole 108 and the trench 106 are filled, as shown in FIG. 13A, a barrier layer 110 of a metal film is formed at first by plasma sputtering, for example, on an entire surface of the wafer W including a surface in the trench 106 and a surface in the communication hole 108, for improving adhesive properties between the wafer surface and a base layer and for preventing diffusion and migration of copper into the insulation layer 104. As the barrier layer 110, there is mainly employed a two-layered structure including a tantalum nitride film (TaN film) and a tantalum film (Ta film), or a two-layered structure including two tantalum films which have been deposited under different (varied) deposition conditions.

Then, as shown in FIG. 13B, by plasma etching using an Ar gas as an inert gas, a part of the barrier layer 110 formed on the bottom part of the communication hole 108 is scraped. Further, the lower wiring layer 102 as a base of the barrier layer 110 is etched so that a scraped recess 112 of a predetermined depth is formed.

Then, as shown in FIG. 13C, a very thin electro-plating seed film 114 is formed on the entire surface including the inner surfaces of the scraped recess 112, of the communication hole 108, and of the trench 106, by sputtering, for example. A copper (Cu) film is used as the seed film 114 because copper plating is performed in the subsequent step, for example.

Then, as shown in FIG. 13D, electro-plating is performed from the seed film 114 as a starting point, so that the scraped recess 112, the communication hole 108, and the trench 106 are respectively filled with the material of an upper wiring layer 116. As described above, copper is used, for example, as the material of the upper wiring layer 116.

Thereafter, as shown in FIG. 13E, the upper unnecessary metal material is removed by grinding or the like, whereby there is formed the upper wiring layer 116 which is electrically connected to the lower wiring layer 102.

Due to the provision of the communication hole 108 such as a through hole or a via hole in the bottom part of the trench 106, the recess 105 has a two-stepped cross-section. Such a shape of the recess 105 is referred to as a so-called "Dual Damascen structure".

At the plasma etching step shown in FIG. 13B, particles of the barrier layer, which are scattered by etching at a corner indicated by a point P1, for example, are scattered within a predetermined angle range in a certain direction with a specific directivity. This feature does not pose a serious problem when the line width and the groove width are relatively wide. However, since the groove width is as small as about 100 nm, as described above, there is a possibility that the particles, scattered in the certain direction by this feature may adhere to an opposed wall surface to form a deposition projection 118 on the opposed wall surface. When the deposition projection 118 is formed, at the following plasma sputtering step shown in FIG. 13C, the deposition projection 118 generates a shadow, which invites a so-called shadowing phenomenon, because the sputtered particles have a high directivity. Namely, the seed film 114 does not adhere to a shadow part 120 by the deposition projection 118. When there remains a part on which the seed film 114 does not adhere, a void 122 is undesirably generated at that part, as shown in FIG. 13D.

FIGS. 14A and 14B are views for comparing recesses 105 (trenches 106) whose widths L2 are different from each other. In fact, various recesses 5 having different widths L2 may be formed in the surface of the semiconductor wafer W, as shown in FIGS. 14A and 14B. In that case, as shown in FIGS. 14A and 14B, angles θ1 and θ2, which are viewed upward from the bottom parts of the communication holes 108, may differ from each other (θ1<θ2), when aspect ratios of the trenches 106 are different, even if aspect ratios of the communication holes 108 are the same (the diameters L1 thereof are the same). Thus, thicknesses H1 and H2 of the barrier layers 110, which are deposited on the bottom parts of the communication holes 108 as the lowermost layers in the recesses 105, may differ from each other. Because of the difference in the thicknesses H1 and H2 of the barrier layers 110, depths of the scraped recesses 112 formed by scraping the barrier layers 110 may differ from each other.

SUMMARY OF THE INVENTION

In view of the foregoing circumstances, the present invention has been made to effectively solve the same. The object of the present invention is to provide a film deposition method and a film deposition apparatus for forming a metal film on a surface of a recess formed in a surface of an object to be processed, which is capable of scraping a bottom part of the recess by the same depth, regardless of a width of the recess, to always form a scraped recess of the same depth, and of depositing a metal film of a suitable condition on insides of the recess and the scraped recess.

The inventors of the present invention have found that, when a metal film is deposited by a plasma sputtering process, by suitably adjusting process conditions such as a bias voltage, a direct-current electric power to be applied to a metal target, and an electric power for generating a plasma, to control a ratio between neutral atoms and metal particulate ions in metal particles generated from the metal target, a preferable metal film can be effectively deposited on the entire surface of the semiconductor wafer. The present invention has been made based on this finding.

The present invention is a film deposition method of a metal film comprising the steps of: placing an object to be processed having a recess formed in a surface thereof, on a stage in a processing vessel; evacuating the processing vessel to create a vacuum therein; ionizing a metal target in the evacuated processing vessel to generate metal particles including metal ions, by means of a plasma formed by making the plasma from an inert gas; and by applying a bias electric power to the object to be processed placed on the stage to draw (attract) the plasma and the metal particles into the object to be processed, scraping a bottom part of the recess to form a scraped recess, and depositing a metal film on an entire surface of the object to be processed including surfaces in the recess and in the scraped recess.

According to the present invention, when the metal layer such as a barrier layer is deposited, by selectively scraping only the bottom part of the recess to form the scraped recess, and by forming the metal film on the entire surface of the object to be processed including the surfaces in the recess and the scraped recess, the scraped recess of the same depth can be always formed regardless of a width of the recess. Thus, a preferred metal film remarkably excellent in electric resistance, for example, can be deposited on the entire surface of the object to be processed.

For example, it is preferable that the step of depositing the metal film includes: a first film deposition step in which conditions are set in such a manner that a film deposition amount of the metal film on the surface of the object to be processed excluding the recess is substantially equal to an etching amount by the plasma of (based on) the inert gas; and a second film deposition step in which conditions are set in such a manner that a film deposition amount of the metal film on the surface of the object to be processed excluding the recess is slightly larger than an etching amount by the plasma of (based on) the inert gas.

Alternatively, it is preferable that the step of depositing the metal film includes: a first film deposition step in which conditions are set in such a manner that a film deposition amount of the metal film on the surface of the object to be processed excluding the recess is substantially equal to an etching amount by the plasma of the inert gas; and an auxiliary film deposition step in which conditions are set in such a manner that the metal particles are drawn as much as possible in so far as the surface of the object to be processed excluding the recess is not etched by the plasma of the inert gas.

Alternatively, it is preferable that the step of depositing the metal film includes a second film deposition step in which conditions are set in such a manner that a film deposition amount of the metal film on the surface of the object to be processed excluding the recess is slightly larger than an etching amount by the plasma of the inert gas.

In addition, for example, conditions of the step of depositing the metal film are set by controlling, at least, one or more of an electric power for making a plasma, a direct-current electric power to be applied to the metal target, and the bias electric power.

In this case, it is preferable that the electric power for making a plasma is controlled within a range between 500-6000 watts, the direct-current electric power is controlled within a range between 100-12000 watts; and the bias electric power is controlled within a range between 100-2000 watts.

In addition, it is preferable that a base-film forming step of forming a base film is performed before the step of depositing the metal film.

In this case, it is preferable that there is formed a barrier layer of a two-layered structure including the base film and the metal film.

In this case, for example, the base film is a TaN film, and the metal film is a Ta film. Alternatively, the base film is a Ta film, and the metal film is another Ta film to be deposited under film deposition conditions different from those of the base film.

In addition, for example, the recess has a communication hole that will function as a via hole or a through hole, whereby the recess has a two-stepped shape. Alternatively, the recess is a communication hole that will function as a via hole or a through hole.

Further, the present invention is a film deposition apparatus comprising: a processing vessel capable of being evacuated to create a vacuum therein; a stage disposed in the processing vessel, for placing thereon an object to be processed having a recess formed in a surface thereof; a gas introducing unit for introducing a predetermined gas including, at least, an inert gas into the processing vessel; a plasma generating source for generating a plasma of the inert gas in the processing vessel, by means of an electric power for making a plasma; a metal target to which a direct-current electric power is applied, the metal target being disposed in the processing vessel, and being ionized by the plasma; a bias power source for supplying a predetermined bias electric power to the stage; and an apparatus control unit for controlling, at least, the bias power source to form, at least, a scraped recess by scraping a bottom part of the recess in the object to be processed, and to form a metal film on an entire surface of the object to be processed including surfaces in the recess and in the scraped recess.

According to the present invention, when the metal layer such as a barrier layer is deposited, by selectively scraping only the bottom part of the recess to form the scraped recess, and by forming the metal film on the entire surface of the object to be processed including the surfaces in the recess and the scraped recess, the scraped recess of the same depth can be always formed regardless of a width of the recess. Thus, a preferred metal film remarkably excellent in electric resistance, for example, can be deposited on the entire surface of the object to be processed.

For example, the apparatus control unit controls, at least, the bias power source in such a manner that there are performed a first film deposition step in which conditions are set in such a manner that a film deposition amount of the metal film on the surface of the object to be processed excluding the recess is substantially equal to an etching amount by the plasma of the inert gas, and a second film deposition step in which conditions are set in such a manner that a film deposition amount of the metal film on the surface of the object to be processed excluding the recess is slightly larger than an etching amount by the plasma of the inert gas.

Alternatively, the apparatus control unit controls, at least, the bias power source in such a manner that there are performed a first film deposition step in which conditions are set in such a manner that a film deposition amount of the metal film on the surface of the object to be processed excluding the recess is substantially equal to an etching amount by the plasma of the inert gas, and an auxiliary film deposition step in which conditions are set in such a manner that the metal particles are drawn as much as possible in so far as the surface of the object to be processed excluding the recess is not etched by the plasma of the inert gas.

Alternatively, the apparatus control unit controls, at least, the bias power source in such a manner that there is performed a second film deposition step in which conditions are set in such a manner that a film deposition amount of the metal film on the surface of the object to be processed excluding the recess is slightly larger than an etching amount by the plasma of the inert gas.

In addition, it is preferable that the apparatus control unit controls, at least, one or more of an electric power for making a plasma, a direct-current electric power to be applied to the metal target, and the bias electric power.

Furthermore, the present invention is a storage medium storing a computer program for causing a computer to execute a control method of controlling a film deposition apparatus comprising: a processing vessel capable of being evacuated to create a vacuum therein; a stage disposed in the processing vessel, for placing thereon an object to be processed having a recess formed in a surface thereof; a gas introducing unit for introducing a predetermined gas including, at least, an inert gas into the processing vessel; a plasma generating source for generating a plasma of the inert gas in the processing vessel, by means of an electric power for making a plasma; a metal target to which a direct-current electric power is applied, the metal target being disposed in the processing vessel, and being ionized by the plasma; and a bias power source for supplying a predetermined bias electric power to the stage; wherein the control method controls, at least, the bias power source to form, at least, a scraped recess by scraping a bottom part of the recess in the object to be processed, and to form a metal film on an entire surface of the object to be processed including surfaces in the recess and in the scraped recess.

BRIEF DESCRIPTION OF THE DRAWINGS

FIGS. 5A to 5F show a flowchart for explaining a method according to a second embodiment of the present invention;

FIG. 6A is an electron micrograph showing a scraped recess formed by a conventional method, and FIG. 6B is an electron micrograph showing a scraped recess formed by the method of the present invention;

FIGS. 14A and 14B are views for comparing recesses (trenches) whose widths are different from each other.

BEST MODE FOR CARRYING OUT THE INVENTION

Embodiments of the present invention will be described in detail below, with reference to the attached drawings.

Figure 1:
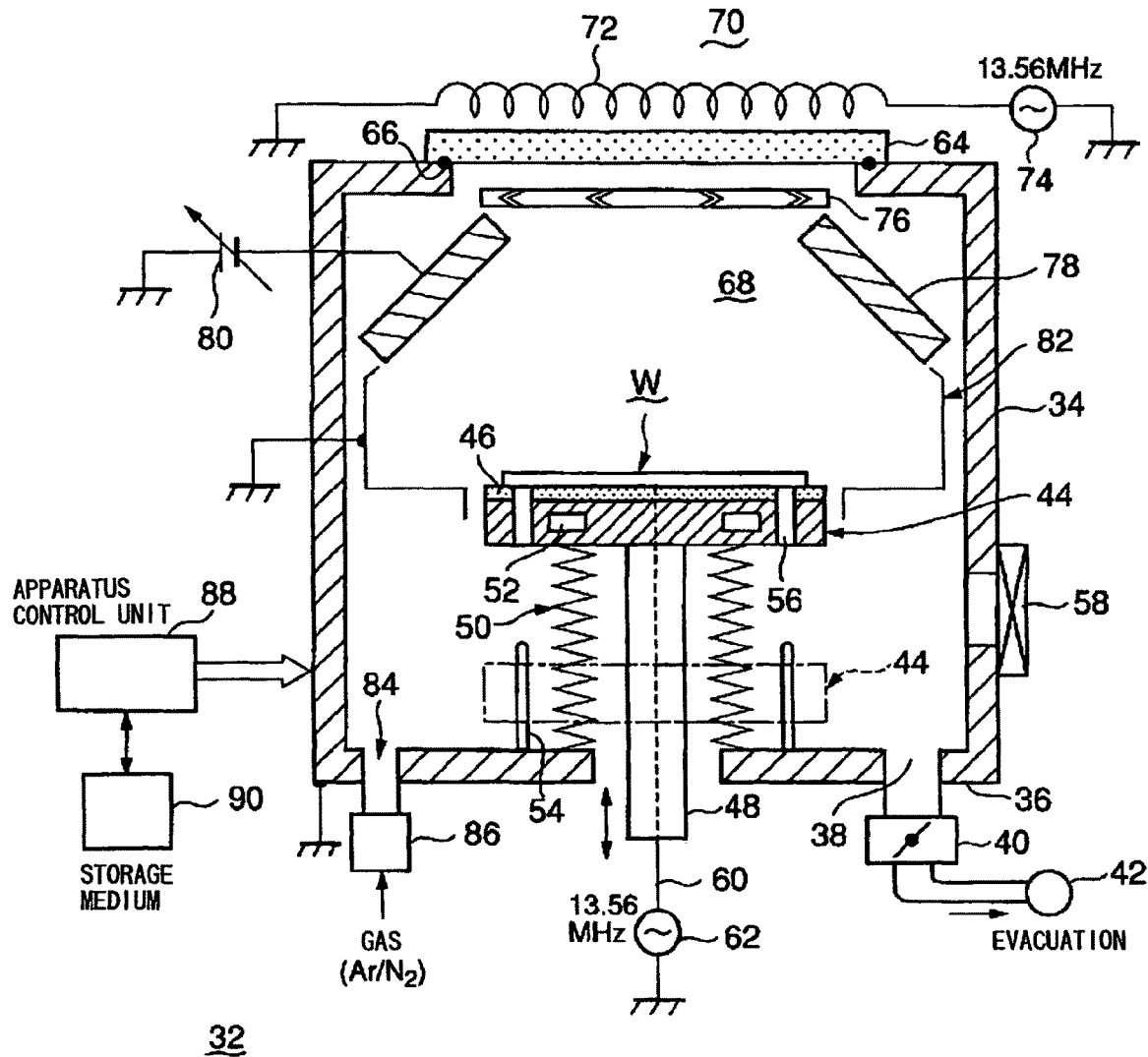
FIG. 1 is a schematic sectional view of a film deposition apparatus according to one embodiment of the present invention.

FIG. 1 is a schematic sectional view of a film deposition apparatus according to one embodiment of the present invention. The film deposition apparatus of the present embodiment is a plasma sputtering apparatus of an ICP (Inductively Coupled Plasma) type. As shown in FIG. 1, the film deposition apparatus 32 includes a cylindrical processing vessel 34 made of, e.g., aluminum. The processing vessel 34 is grounded. An outlet port 38 is disposed in a bottom part 36 of the processing vessel 34. The outlet port 38 is connected to a vacuum pump 42 via a throttle valve 40, whereby an inside of the processing vessel 34 can be evacuated to create a vacuum therein.

A discoid stage 44 made of, e.g., aluminum is disposed in the processing vessel 34. An electrostatic chuck 46 is placed on an upper surface of the stage 44. A direct-current voltage for absorption can be applied to the electrostatic chuck 46 according to need. Thus, a semiconductor wafer W as an object to be processed can be absorbed by and held on the electrostatic chuck 46. The stage 44 is supported by a pillar 48 extending downward from a central part of a lower surface of the stage 44. A lower part of the pillar 48, which passes through the bottom part 36 of the processing vessel 34, can be moved upward and downward by an elevating mechanism, not shown. Thus, the stage 44 itself can be vertically moved.

Elongatable metal bellows 50 are disposed to surround the pillar 48. An upper end of the metal bellows 50 is hermetically joined to the lower surface of the stage 44, and a lower end of the metal bellows 50 is hermetically joined to an upper surface of the bottom part 36. Thus, the stage 44 can be vertically moved, while an inside of the processing vessel 34 can be hermetically sealed. The stage 44 is equipped with a cooling-medium circulating channel 52 through which a cooling medium for cooling the wafer W flows. The cooling medium is supplied and discharged through channels, not shown, in the pillar 48.

A plurality of, e.g., three support pins 54 (two support pins 54 are illustrated) project upward from the bottom surface 36 of the processing vessel 34. Pin insertion holes 56 respectively corresponding to the support pins 54 are formed in the stage 44. Thus, when the stage 44 is lowered, the wafer W can be received on upper ends of the support pins 54 passing through the pin insertion holes 56. Therefore, the wafer W can be transferred between the support pins 54 and a transfer arm, not shown, which enters from outside. A gate valve 58, which is capable of being opened and closed for allowing the transfer arm to enter the processing vessel 34, is arranged in a lower sidewall of the processing vessel 34.

Connected to the electrostatic chuck 46 on the stage 44 through a wiring 60 is a bias power source 62 formed of a radiofrequency power source capable of generating a radiofrequency of, e.g., 13.56 MHz. Thus, a predetermined bias electric power can be applied to the stage 44. The bias power source 62 can control the bias electric power, that is an output thereof, according to need.

In a ceiling part of the processing vessel 34, there is hermetically disposed, through a sealing member 66 such as an O-ring, a transmission plate 64 which is formed of a dielectric material such as nitride aluminum and is transmissive to a radiofrequency. A plasma generating source 70 for generating a plasma by making the plasma from an Ar gas as a plasma gas is disposed on an opposite side of the transmission plate 64 relative to a processing space 68 in the processing vessel 34. To be specific, the plasma generating source 70 includes an induction coil part 72 located near the transmission plate 64, and a radiofrequency power source 74 connected to the induction coil part 72, for generating a radiofrequency of, e.g., 13.56 MHz to generate (make) a plasma. Thus, a radiofrequency can be introduced into the processing space 68 through the transmission plate 64. A plasma electric power outputted from the radiofrequency power source 74 can be controlled according to need. In place of Ar, another inert gas, such as He and Ne, may be used as a plasma gas.

A baffle plate 76 made of, e.g., aluminum is disposed directly below the transmission plate 64, for diffusing the radiofrequency to be introduced into the processing space 68. Positioned below the baffle plate 76 is an annular (truncated-conical shell shaped) metal target 78 having an inwardly inclined section, for example, to surround an upper lateral part of the processing space 68. A variable direct-current power source 80 is connected to the metal target 78. A direct-current electric power outputted from the variable direct-current power source 80 can be controlled according to need.

The metal target 78 is made of tantalum metal and/or copper, for example. These metals are sputtered as metal atoms or metal atom groups by Ar ions in the plasma, while a large amount of these metals is ionized when the metals pass through the plasma.

A cylindrical protection cover 82 made of, e.g., aluminum is arranged below the metal target 78 to surround the processing space 68. The protection cover 82 is grounded. A lower part of the protection cover 82 is bent inward so as to be positioned near a lateral part of the stage 44. Disposed in the bottom part 36 of the processing vessel 34 is a gas inlet port 84 as a gas introducing unit for introducing a required gas into the processing vessel 34. A plasma gas, such as an Ar gas, and another required gas, such as an $N_2$ gas, are supplied from the gas inlet port 84 through a gas control unit 86 including a gas flow rate controller, a valve, and so on.

The respective elements of the film deposition apparatus 32 are connected to an apparatus control unit 88 formed of, e.g., a computer, to be controlled by the apparatus control unit 88. More specifically, the apparatus control unit 88 controls operations of the bias power source 62, the radiofrequency power source 74 for generating a plasma, the variable direct-current power source 80, the gas control unit 86, the throttle valve 40, the vacuum pump 42, and so on. In particular, when a metal film is deposited, the following control is performed.

At first, the vacuum pump 42 is operated under control of the apparatus control unit 88, so that the processing vessel 34 is evacuated. Then, an Ar gas is supplied into the evacuated processing vessel 34, while the gas control unit 86 is being operated. Further, the throttle valve 40 is controlled such that the inside of the processing vessel 34 is maintained at a predetermined vacuum degree. Thereafter, a direct-current electric power is applied to the metal target 78 via the variable direct-current power source 80, and a radiofrequency electric power (plasma electric power) is applied to the induction coil part 72 via the radiofrequency power source 74.

On the other hand, the apparatus control unit 88 sends a command to the bias power source 62 to apply a predetermined bias electric power to the stage 44. In the processing vessel 34 that has been controlled as described above, an argon plasma is generated by the plasma electric power that has been applied to the induction coil part 72 to generate argon ions. The argon ions collide with the metal target 78, whereby the metal target 78 is sputtered to release metal particles.

Most of the metal atoms and/or metal atom groups as the metal particles released from the sputtered metal target 78 are ionized when passing through the plasma. The metal particles (metal atoms and/or metal atom groups), in which ionized metal ions and electrically neutral metal atoms are mixed, are scattered downward. Then, the metal ions are particularly drawn by the bias electric power applied to the stage 44, and are deposited on the wafer W as metal ions having a high directivity to the wafer W.

As described below, the apparatus control unit 88 is capable of allowing the Ar ions in the plasma to be drawn toward the stage 44, by sending a command to the bias power source 62 to output a large electric power, for example. Therefore, both film deposition and sputter etching can be simultaneously carried out.

The respective elements of the apparatus are adapted to be controlled by the apparatus control unit 88 based on a program that has been made beforehand such that a step of depositing a metal film is performed under predetermined conditions. The program including various commands for the control operation is stored in a storage medium 90, such as a floppy disc (registered trademark) (FD), a compact disc (registered trademark) (CD), and a flush memory. Based on this program, the respective elements are controlled such that the step of depositing a metal film is performed under the predetermined conditions.

Next, the film deposition method of the present invention performed by the film deposition apparatus 32 as structured above is described below.

Figure 2:
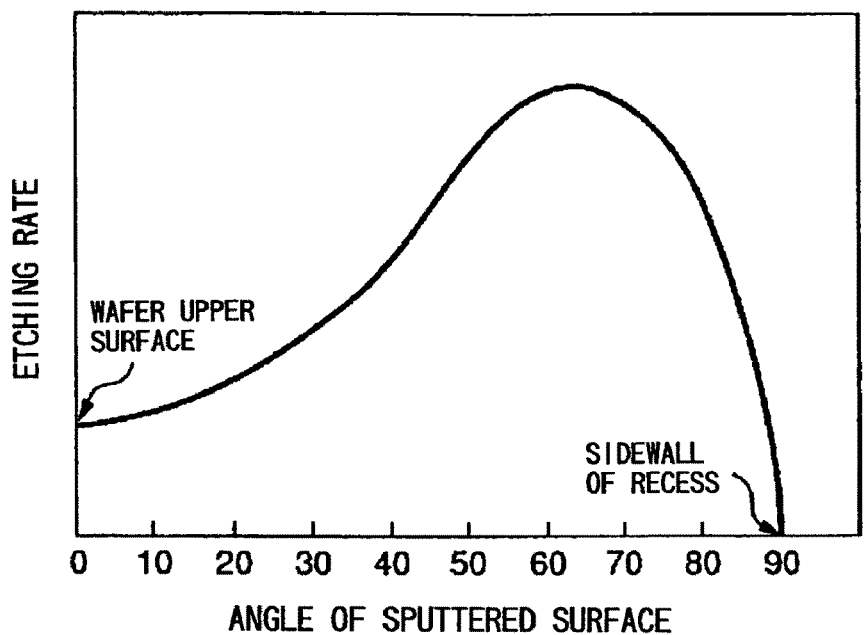
FIG. 2 is a graph showing an angular dependency of sputter etching.
Figure 3:
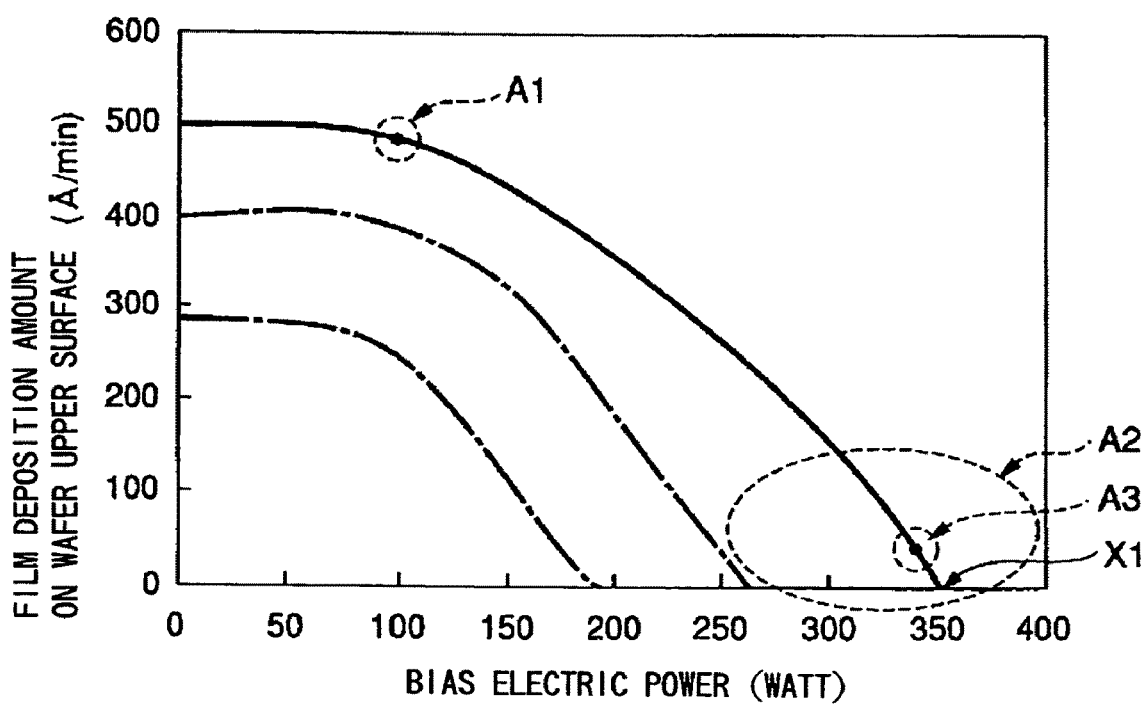
FIG. 3 is a graph showing a relationship between a bias electric power and a film deposition amount on an upper surface of a wafer.

FIG. 2 is a graph showing an angular dependency of sputter etching. FIG. 3 is a graph showing a relationship between a bias electric power and a film deposition amount on an upper surface of a wafer. FIGS. 4A to 4G show a flowchart for explaining a method according to a first embodiment of the present invention.

A feature of the present method is that, when a metal film is formed by a sputtering film deposition process by means of a plasma at a certain step in a series of film deposition processes, values of a bias electric power, a direct-current electric power, a plasma electric power, and so on are suitably controlled, so as to simultaneously perform a film deposition by drawing of metal ions and a sputter etching by a plasma gas (Ar ion), and so as also to set a state in which a bottom part of the lowermost layer in a recess formed in a semiconductor wafer can be scraped so that the bottom part of the lowermost layer in the recess is scraped to form a scraped recess and that a metal film is deposited on surfaces of the recess and the scraped recess. To be specific, a value of the bias electric power at this step is set such that a rate of the film deposition by drawing of the metal ions and an etching rate of the sputter etching by the plasma gas (Ar+) are substantially equal to each other, on a surface of the wafer facing the metal target 78, i.e., an upper surface of the wafer shown in FIG. 1.

This point is described in more detail.

Figure 12A:
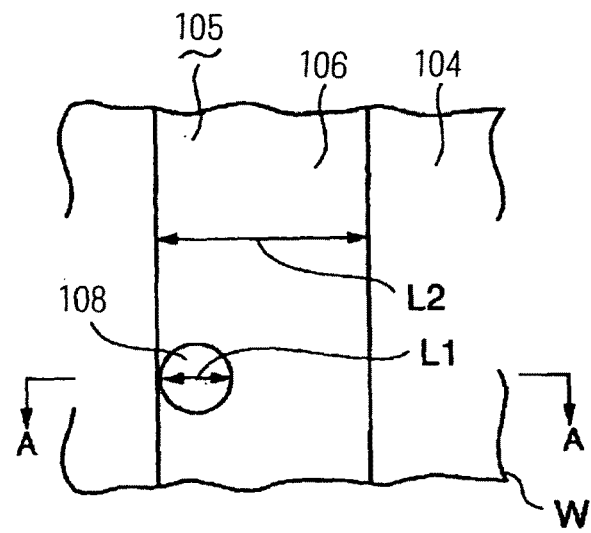
FIGS. 12A to 12C are views showing a communication hole formed in a semiconductor wafer, the communication hole not yet being filled.
Figure 12B:
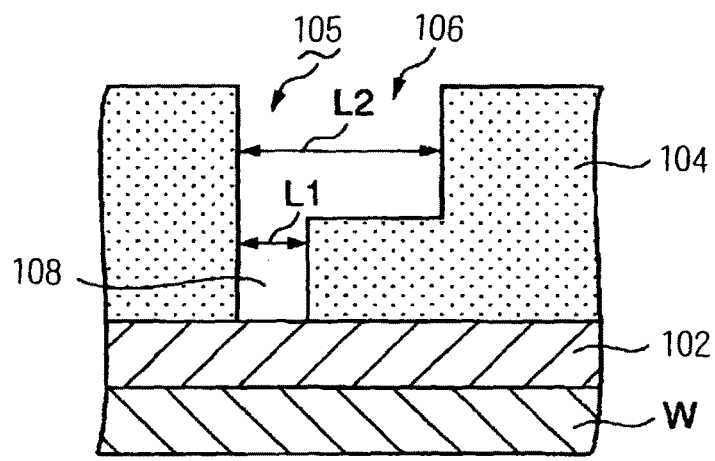
Figure 12C:
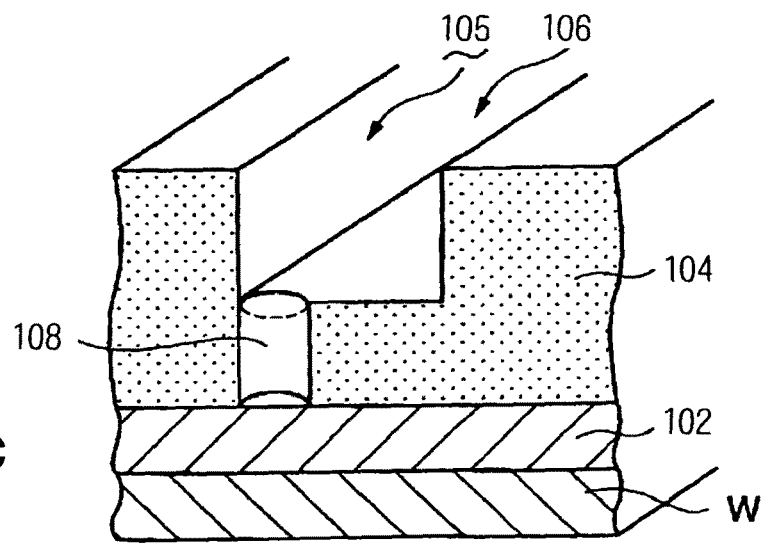

In the first place, a feature of an etching rate of the sputter etching by a plasma gas is examined without considering a film deposition amount. A relationship between an angle of a surface to be sputtered and an etching rate thereof is shown in the graph of FIG. 2. The angle of a surface to be sputtered is an angle defined by a normal line of the sputtered surface and an incident direction (downward direction in FIG. 1) of a sputtering gas (Ar ion: Ar+). For example, the angle is "0 degree" at an upper surface of the wafer and at a bottom part of a recess 5 (see, FIG. 12), and is "90 degrees" at a sidewall of the recess.

As clearly understood from the graph of FIG. 2, the wafer upper surface (angle of the sputtered surface=0 degree) is sputtered to a some degree, while the sidewall of the recess (angle of the sputtered surface=90 degrees) is barely sputter-etched. Meanwhile, a corner part of the opening of the recess (angle of the sputtered surface=about 40 degrees to about 80 degrees) is sputter-etched to a considerable degree.

In the film deposition apparatus formed of an ICP-type sputtering apparatus as shown in FIG. 1, a relationship between a bias electric power to be applied to a wafer W and a deposition amount of a film deposited on the wafer upper surface (not the sidewall of the recess) is shown in FIG. 3. That is to say, with a certain plasma electric power and a certain direct-current electric power (applied to the metal target 78), when the bias electric power is not so large, a large film deposition amount can be obtained by drawing of metal ions and neutral metal atoms following thereto, but when the bias electric power is increased, the wafer surface tends to be more and more sputtered by argon ions as a plasma gas which is accelerated by the bias electric power (see, FIG. 2), so that the metal film which has been once deposited is etched. Naturally, this etching action becomes stronger, as the bias electric power is increased more. Thus, when a rate of the film deposition by drawing of metal ions and neutral metal atoms following thereto, and an etching rate of the sputter etching by ions of the plasma gas, are equal to each other, the film deposition and the etching are balanced out, whereby a film deposition amount on the wafer upper surface is "zero". The conditions for this situation correspond to the point X1 (bias electric power: 350 W) in FIG. 3. The bias electric power and the film deposition amount shown by the solid line in FIG. 3 should be regarded as mere examples. By controlling the plasma electric power and the direct-current electric power, the characteristic curve can be varied, as indicated by the two chain-dot lines in FIG. 3.

Values of general operation conditions in the sputtering apparatus of this type have been conventionally included in the area A1. Namely, in this area, a film deposition amount (film deposition rate) can be increased with a bias electric power that is not so large. In other words, in this area, while a film deposition amount is substantially the same as in a case where the bias electric power is zero (there is no etching by the plasma of the inert gas), an amount of the metal ions to be drawn is the largest, i.e., a largest amount of the metal particles is drawn. Thus, in this area, a film can be deposited even on the bottom part of the recess to a some degree.

On the other hand, at the step of forming a metal film according to the present invention, there is selected values within an area in which the film deposition by the drawn metal ions as well as neutral metal atoms and the sputter etching by the plasma gas occur at the same time. More particularly, there is selected values within the area A2 in which a film deposition rate by the drawn metal ions as well as neutral metal atoms and an etching rate of the sputter etching by the plasma gas are substantially equal to each other, on an upper surface of a wafer. Herein, being "substantially equal" includes not only a case in which a film deposition amount on the wafer upper surface is "zero", but also a case in which a deposited film has a thickness that is as small as ³⁄₁₀ as compared with a thickness of the film deposited under conditions within the area A1.

On the basis of the understanding of the above phenomenon, the present method is described in more detail below.

At first, a wafer W is loaded into the processing vessel 34 capable of being evacuated, via the gate valve 58 of the processing vessel 34, while the stage 44 rests at a lowered position. The wafer W is supported on the support pins 54. Then, the stage 44 is elevated from this state, so that the wafer W is delivered to an upper surface of the stage 44. The wafer W is absorbed on the upper surface of the stage 44 by the electrostatic chuck 46.

After the wafer W is placed on the stage 44 and fixedly absorbed thereto, the film deposition process is started. Before the wafer W is loaded, the recess 5 (see, FIG. 4A) has been already formed in an upper surface of the wafer W at the preceding step, which is similar to the process described with reference to FIG. 12B. Namely, an insulation layer 4 is formed on a lower wiring layer 2 made of Cu, and the recess 5 is formed in the insulation layer 4. The recess 5 has a wiring groove of a predetermined width, i.e., a trench 6, for forming an upper wiring layer. In a portion of a bottom part of the trench 6, there is formed a communication hole 8 which passes through the insulation layer 4 to reach the lower wiring layer 2. Thus, the recess 5 has a two-stepped shape as a whole. The communication hole 8 will function as a via hole and a through hole.

After the inside of the processing vessel 34 is evacuated to a predetermined pressure, a plasma electric power is applied to the induction coil part 72 of the plasma generating source 70, and a predetermined bias electric power is applied from the bias power source 62 to the electrostatic chuck 46 of the stage 44. Further, a predetermined direct-current electric power is applied to the metal target 78 from the variable direct-current power source 80. Then, the film deposition process is started. In this embodiment, tantalum is used as the metal target 78.

Figure 4A:
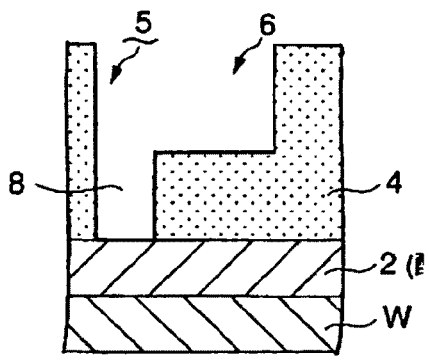
FIGS. 4A to 4G show a flowchart for explaining a method according to a first embodiment of the present invention.
Figure 4E:
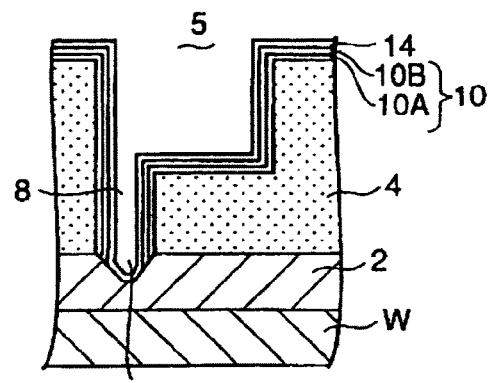
Figure 4B:
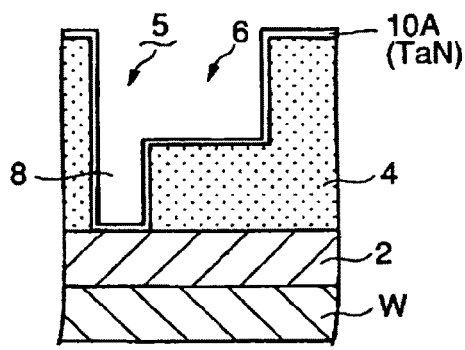

Specifically, as shown in FIG. 4B, a base-film forming step of forming a base film 10A is firstly performed. In order to form a TaN film, a plasma gas, such as an Ar gas, and an $N_2$ gas as a nitriding gas, are supplied from the gas inlet port 84 into the processing vessel 34. Thus, as shown in FIG. 4B, a TaN film as the base film 10A is substantially uniformly formed not only on an upper surface of the wafer W, but also on a sidewall and a bottom surface of the recess 5. A value of the bias electric power at this step is within the area A1 shown in FIG. 3, which is the same as the conventional, general film deposition conditions. Specifically, the bias electric power is about 100 W (watts).

After the formation of the base film 10A is completed as described above, a metal film forming step, which is a characteristic feature of the present invention, is performed to form a Ta film as a metal film. That is, at the metal film forming step, the bias electric power is increased for employing the conditions in the area A2 shown in FIG. 3. The metal film forming step in this embodiment includes: a first film deposition step in which conditions are set such that an amount of a film deposited by metal particles and an amount of etching by the plasma of the inert gas are substantially equal to each other, on the surface of the wafer W excluding the recess 5; and a second film deposition step in which conditions are set such that an amount of a film deposited by the metal particles is slightly larger than an amount of etching by the plasma of the inert gas, on the surface of the wafer W excluding the recess 5.

Figure 4F:
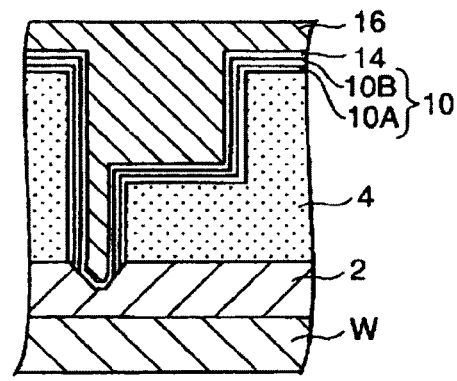
Figure 4C:
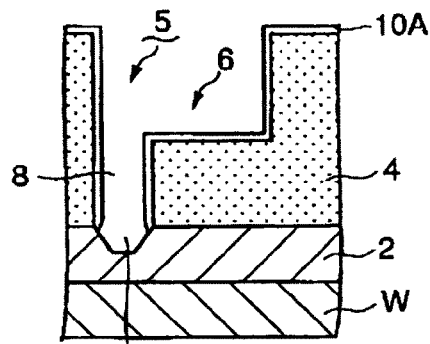

At first, at the first film deposition step, the bias electric power is set at the point X1 shown in FIG. 3 in order to make "zero" the film deposition amount on the wafer upper surface. Specifically, the bias electric power at this step is 350 W. At this time, supply of the $N_2$ gas from the gas inlet port 84 is stopped, and only the Ar gas is supplied. Thus, as shown in FIG. 4C, a bottom part of the lowermost layer in the recess 5 (corresponding to the communication hole 8) is scraped, i.e., an upper surface of the wiring layer 2 made of Cu is scraped, so that a scraped recess 12 is formed therein. Meanwhile, almost no film is formed on the other surfaces, i.e., the uppermost surface of the wafer W and the central stepped surface of the wafer W.

The reason is as follows. That is to say, by setting a value of the bias electric power within the area A2, more particularly at the point X1 shown in FIG. 3, as described above, a rate of the film deposition by the drawn metal ions as well as neural metal atoms, and an etching rate of the sputter etching by the plasma gas (Ar+), become substantially equal to each other on the upper surface of the wafer W. Thus, a film deposition amount of the metal film comes to substantially zero. On the contrary, since the etching rate is larger than the film deposition rate on the bottom part of the communication hole 8 of the recess 5, the bottom part of the communication hole 8 is scraped. To describe these matters at an atomic level with respect to a wafer unit area is as follows.

<Wafer Upper Surface>

$Ta + \Sigma Ta^+ = \Sigma Ar^+$

<Bottom Part of Communication Hole 8>

$\Sigma Ta^+ < \Sigma Ar^+$

Herein, Ta depicts a neutral metal atom, and $Ta^+$ depicts a metal ion. Both the Ta atoms and the $Ta^+$ ions contribute to deposition of a metal film. On the other hand, $Ar^+$ depicts an Ar ion which contributes to etching. Both the Ta atoms and the $Ta^+$ ions sufficiently reach the wafer upper surface, and the $Ar^+$ ions also sufficiently reach there. As a result, a film deposition amount becomes "zero" (balanced out).

On the other hand, since a diameter of the communication hole 8 is significantly small, the $Ta^+$ ions and the $Ar^+$ ions, each having a high directivity, can reach the bottom part of the communication hole 8, but it is difficult for the Ta atoms that are neutral metal atoms having an inferior directivity to reach there. As a result, the bottom part of the communication hole 8 is scraped by an amount equal to the Ta atoms that do not reach there, which might otherwise contribute to the film deposition. An amount of the bottom part of the communication hole 8 to be scraped can be controlled by changing a process period of the first film deposition step. For simplification of the description, it is supposed that one Ta or one $Ta^+$ jumps out (to be etched) from the deposited film by collision of one $Ar^+$.

After the first film deposition step is finished, the second film deposition step succeeds. At the second film deposition step, the bias electric power is set at a point other than the point X1 in the area A2, for example, at the point A3, so that a metal film of a slight thickness is formed at a film deposition rate which is significantly smaller than the film deposition rate when a value of the bias electric power is set within the area A1. Thus, as shown in FIG. 4D, a Ta film 10B as a metal film is deposited on the entire surface of the wafer excluding the bottom part of the communication hole 8, i.e., a surface in the recess 5 (including the side surface of the communication hole 8). Also in this case, the etching rate is larger than the film deposition rate on the bottom part of the communication hole 8, which reason is as described above, no Ta film adheres thereto, and the bottom part of the communication hole 8 is further scraped. Thus, a concave shape of the scraped recess 12 is further enlarged. That is, on the wafer upper surface, "$\Sigma Ta + \Sigma Ta^+ > \Sigma Ar^+$", while on the bottom part of the communication hole 8, "$\Sigma Ta^+ < \Sigma Ar^+$". The etching rate on the bottom part is smaller than that of the first film deposition step, since an amount of the metal particles contributing to the film deposition is set larger than an amount of the sputtering ions in order that the film is slightly deposited on the wafer upper surface.

As described above, regarding the step of forming the scraped recess, the film deposition amount and the sputter etching amount on the wafer surface are equal to each other at the first film deposition step. Thus, even after the process shown in FIG. 4C is finished, the thickness of the base film 10A shown in FIG. 4B is kept unchanged. Thus, regardless of the depth of the hole of the scraped recess, the thickness of the base film 10A shown in FIG. 4B is, e.g., 3.5 nm on the wafer surface, and e.g., 1.0 nm on the bottom part of the communication hole 8. These values are preferable ones to provide an extremely thin film, that is, not more than 10 nm which is preferable, and not more than 5 nm which is more preferable.

Figure 13A:
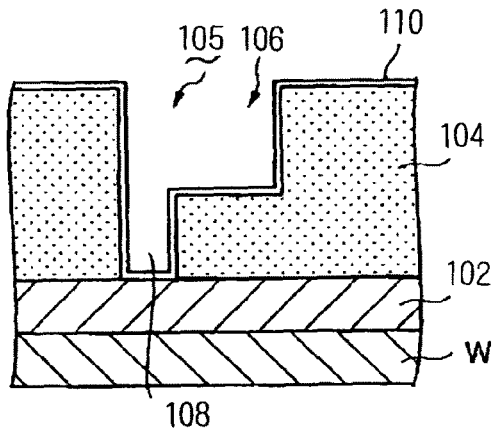
FIGS. 13A to 13E are views for explaining a filling step of the communication hole.
Figure 13D:
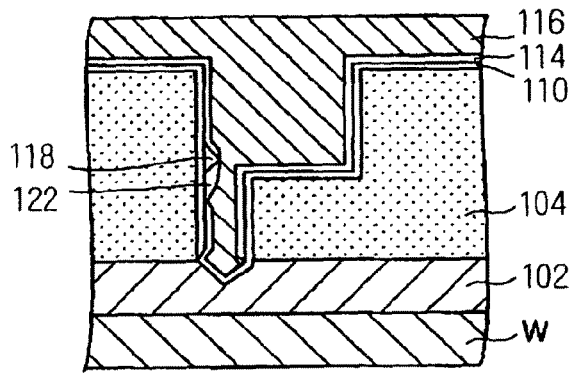
Figure 13B:
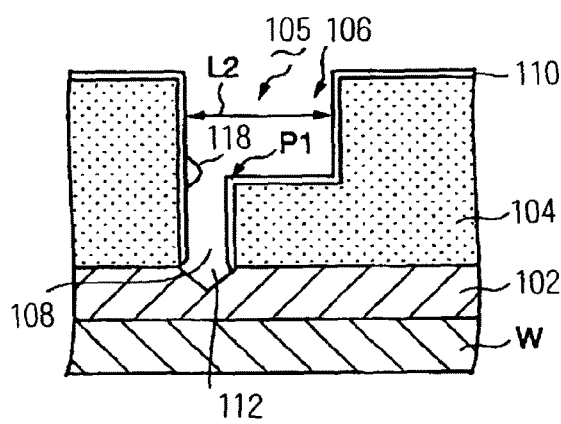
Figure 13E:
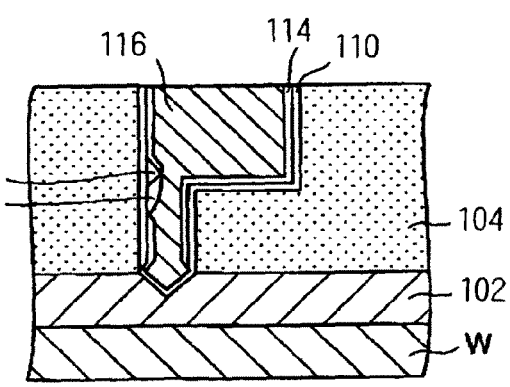
Figure 13C:
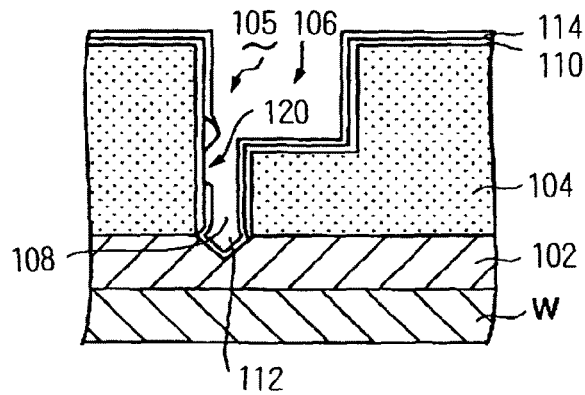

On the contrary, at a conventional step of forming a scraped recess, the thickness of the barrier layer 110 shown in FIG. 13A depends on the depth of the hole of the scraped recess. When the scraped recess is about 50 nm in depth, the barrier layer 110 has to have a thickness of about 60 nm on the wafer surface. This is because, at the Ar etching process shown in FIG. 13B, the wafer surface is simultaneously etched. When the barrier layer of 60 nm in thickness is formed on the wafer surface, a barrier layer of about 10 nm to 20 nm in thickness is inevitably formed on the bottom part of the communication hole. In this case, at the etching step (see, FIG. 13B), a scraped recess is not initially formed, but only the barrier layer is etched. As described below, this invites lowering of an etching rate of the lower wiring layer 2 made of copper, when a scraped recess is formed.

In this embodiment, process conditions are set such that the film deposition amount on the wafer surface is substantially zero, throughout the first film deposition step and the second film deposition step. Thus, there is no possibility that the deposition projection 18 is generated on the side surface of the recess, which situation has been described with reference to FIG. 13B. In addition, since the very thin base film can be realized on the bottom part of the communication hole, the depth of the scraped recess 12 in this embodiment can be substantially made uniform within a plane of the wafer, regardless of the width L2 of each recess.

As described above, by forming the metal film 10B formed of the Ta film, a barrier layer 10 in which the TaN film and the Ta film are stacked is formed. Then, the wafer W is loaded into a film deposition apparatus having the same structure as that of the film deposition apparatus shown in FIG. 1, except that a metal target thereof is not made of tantalum but made of copper. In this apparatus, a value of the plasma electric power is set within the area A1 shown in FIG. 3. Then, under the same conditions as the conventional ones, a thin seed film 14 made of copper is formed not only on the wafer upper surface but also on the sidewall and the bottom part in the recess 5, which is shown in FIG. 4E.

The film deposition apparatus provided with the copper metal target is preferably connected to the film deposition apparatus provided with the tantalum metal target, via a transfer chamber capable of being vacuumed. In this case, a semiconductor wafer W can be transferred between the film deposition apparatuses in a vacuum atmosphere, without being exposed to an atmospheric air.

After the seed film 14 has been formed, the wafer W is taken out from the film deposition apparatus, and is then subjected to a general plating process. Thus, as shown in FIG. 4F, the recess 5 is completely filled with a copper material for a wiring layer 16.

Figure 4G:
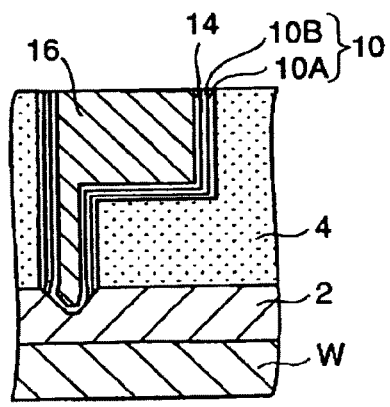
Figure 4D:
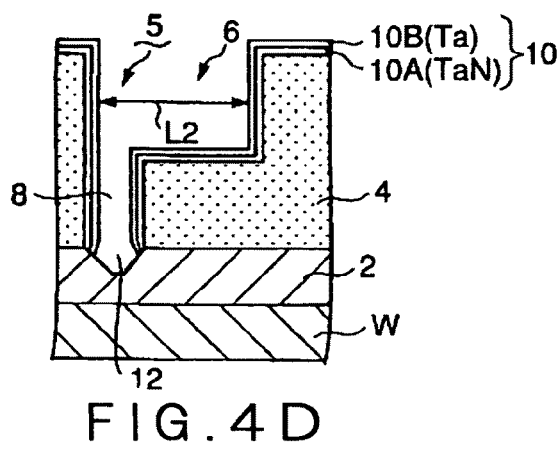

Then, as shown in FIG. 4G, an unnecessary part on the wafer upper surface is removed by grinding. Thus, formation of the upper wiring layer 16 is completed.

As described above, in this embodiment, by appropriately selecting the process conditions when a metal film such as the barrier film is deposited, the metal film can be formed on the entire surface of an object to be processed (wafer W) including the surface in the recess 5, while only the bottom part of the lowermost layer of the recess 5 can be selectively scraped. In particular, regardless of the width of the recess 5, the bottom part can be scraped to the same depth, whereby the scraped recess of the same depth can be always formed.

Conditions to be set for the metal film forming step (first and second film deposition steps), namely, set conditions capable of achieving a state in the area A2 shown in FIG. 3, are as follows.
plasma electric power: 500-6000 W
direct-current electric power: 100-12000 W
bias electric power: 100-2000 W In practice, as described above, by suitably setting the three conditions, the set conditions (operation point) in the area A2 is realized. When conditions are set in an area other than the area A2, it is impossible to fully form the scraped recess 12, and thus the so-called punch-through structure cannot be formed.

Other process conditions are as follows. That is, a flowrate of the Ar gas is between about 50 sccm and about 1000 sccm, and a process pressure is between about 0.001 Torr (0.1 Pa) and about 0.1 Torr (13.3 Pa).

As to the step of forming a base film, there has been described that the TaN film is formed as the base film 10A. However, in place thereof, a Ta film may be formed as the base film 10A. In this case, since the Ta film 10B is formed on the Ta film serving as the base film 10A, the barrier layer 10 has a two-layered structure in which two Ta films that have been deposited under different film deposition conditions are stacked.

In the above embodiment, at the step shown in FIG. 4C, although the operation point is set at the point X1 shown in FIG. 3, so as to form the scraped recess 12 without depositing a Ta film, the present invention is not limited thereto. For example, a second embodiment is possible in which the step shown in FIG. 4C in the flowchart of FIGS. 4A to 4G is omitted, and thus the step shown in FIG. 4B directly proceeds to the step shown in FIG. 4D so as to form the scraped recess 12 and to deposit the Ta film 10B at the same time. Namely, in the second embodiment, the second film deposition step shown in FIG. 4D is performed immediately after completion of the step shown in FIG. 4B, without performing the first film deposition step shown in FIG. 4C.

FIGS. 5A to 5F show a flowchart for explaining the method according to the second embodiment of the present invention. In FIGS. 5A to 5F, the same elements as those shown in FIGS. 4A to 4G are shown by the same reference numbers. FIGS. 5A and 5B correspond to FIGS. 4A and 4B, respectively. FIGS. 5C to 5F correspond to FIGS. 4D to 4G, respectively. In this embodiment, a TaN film deposition step shown in FIG. 5B directly proceeds to a second film deposition step shown in FIG. 5C, without performing the first film deposition step. In this case, since the first film deposition step is not carried out, a scraped recess 12 has a reduced depth. However, due to the omission of the first film deposition step, the process period can be shortened.

The scraped recesses formed according to a method of the present invention and a conventional method were evaluated. The evaluation result is described below.

FIG. 6A is an electron micrograph showing a scraped recess formed by a conventional method, and FIG. 6B is an electron micrograph showing a scraped recess formed by a method of the present invention. With a view to facilitating understanding, schematic views are respectively added to the electron micrographs. Herein, not a two-stepped recess but a one-stepped recess was evaluated.

In the case of the conventional method as shown in FIG. 6A, an undesirable deposition projection 18 was formed in an upper opening of a recess 5. On the other hand, in the case of the present method as shown in FIG. 6B, it was confirmed that no deposition projection 18 was formed in an upper opening of a recess 5, and that a scraped recess 12 in a favorable state could be formed.

Next, a dependency of an aspect ratio of a scraped recess 12 formed in a bottom part of a recess 5 was evaluated. The evaluation result is described below.

Figure 7:
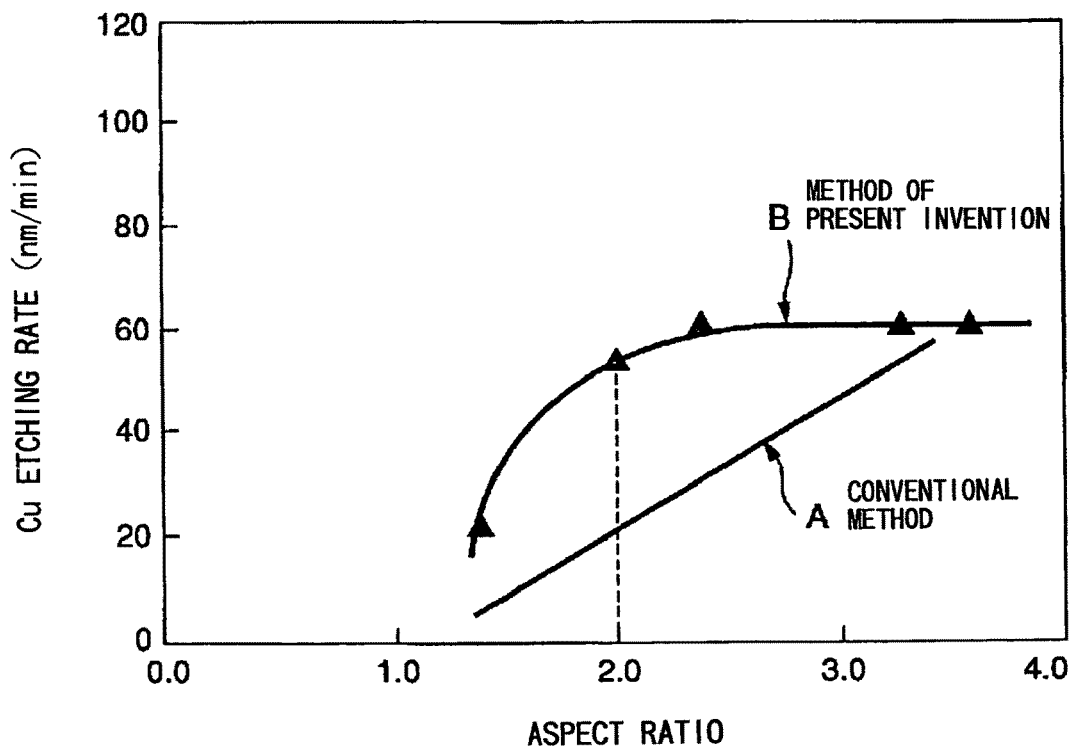
FIG. 7 is a graph showing a relationship between an aspect ratio of a recess (including a communication hole) and a copper etching rate on a bottom part of the recess.

FIG. 7 is a graph showing a relationship between an aspect ratio of a recess (including a communication hole) and a copper etching rate on a bottom part of the recess. Also in this test, not a two-stepped recess but a one-stepped recess was evaluated. In FIG. 7, the feature A shows the relationship according to a conventional method, and the feature B shows the relationship according to a method of the present invention.

Specifically, in the test according to the conventional method, a barrier layer of about 60 nm was plasma-sputtered on a surface of a wafer having a plurality of recesses of various aspect ratios, and then Ar etching was performed for a predetermined period of time. Depths of the thus formed scraped recesses were measured to obtain copper etching rates. Meanwhile, in the test according to the method of the present invention, a base film of about 4 nm was plasma-sputtered on a surface of a wafer having a plurality of recesses of various aspect ratios, and the first film deposition step (see, FIG. 4C), which is a characteristic feature of the present invention, was performed for the same period of time as that of the conventional method. Depths of the thus formed scraped recesses were measured to obtain copper etching rates.

As clearly shown in FIG. 7, in both of the features A and B, when the aspect ratio is small, a larger amount of film is deposited on the bottom part of the recess, as compared with the larger aspect ratio. Thus, the copper etching rate is decreased. In the case of the conventional method shown by the feature A, it can be understood that the copper etching rate varies in accordance with the increase in the aspect ratio. In other words, the depth of the scraped recess 12 varies depending on the variation in the aspect ratio, which is not preferable. On the other hand, in the case of the present method shown by the feature B, it can be understood that, although the copper etching rate largely varies when the aspect ratio is not more than 2, the copper etching rate is substantially constant when the aspect ratio is not less than 2.

A general recess 5 has an aspect ratio not less than 2. Thus, according to the present invention, it was confirmed that a preferable result could be obtained in that the depths of the scraped recesses 12 could be made substantially uniform regardless of the aspect ratio. Since the depths of the scraped recesses 12 are unsusceptible to the shapes of the recesses 5, the scraped recesses of the same depth can be unfailingly formed regardless of the width of each recess.

Figure 8:
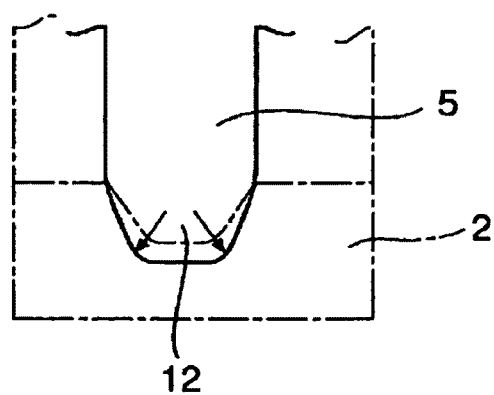
FIG. 8 is an enlarged sectional view of the scraped recess.

In the above embodiment, although the Ta film 10B is formed at the step shown in FIG. 4D and the seed film 14 is subsequently formed at the step shown in FIG. 4E, the present invention is not limited thereto. For example, an etching step by an inert gas such as an Ar gas may be intervened between the above steps, to thereby improve a sectional shape of the scraped recess 12. FIG. 8 shows an example of the improved sectional area. FIG. 8 is an enlarged sectional view of the scraped recess 12. In the example shown in FIG. 8, following to the step of forming the Ta film 10B shown in FIG. 4D, a plasma etching step using an Ar gas is performed to further enlarge a bottom part of the scraped recess 12 so that the scraped recess 12 has an inverted trapezoidal sectional shape. Thus, a contact area and an adhesion degree between the recess 12 and a material to be filled therein are improved to thereby reduce a contact resistance therebetween. In this case, it is necessary to scrape only the Cu material as the wiring layer 2, without scraping the Ta film 10B. Such an operation can be achieved by adjusting the bias electric power.

Figure 9:
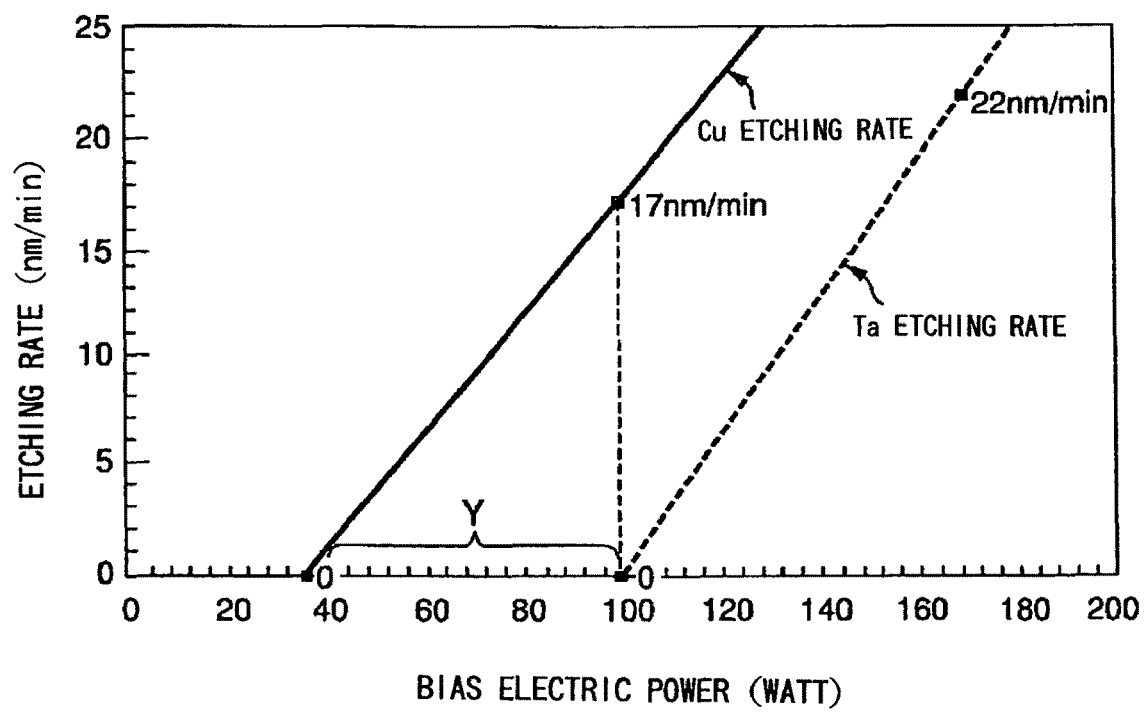
FIG. 9 is a graph showing an example of dependency of etching rates of a Ta film and a Cu material relative to a bias electric power.

FIG. 9 is a graph showing an example of dependency of etching rates of the Ta film and the Cu material relative to the bias electric power. As understood from FIG. 9, etching of the Cu material is started when the bias electric power becomes not less than 40 watts, and etching of the Ta film is started when the bias electric power becomes not less than 100 watts. Thus, in the case shown in FIG. 9, it can be confirmed that, by setting a value of the bias electric power within the area Y in which the bias electric power ranges from 40 watts to 100 watts, only the Cu material can be selectively etched, without scraping the Ta film. The characteristic linear line shown in FIG. 9 may move in the right and left direction, depending on a value of the plasma electric power or the like, and the area Y may move in the right and left direction in accordance therewith.

The following manner may be employed as a third embodiment. That is, although in the first embodiment, the first film deposition step shown in FIG. 4C and the second film deposition step shown in FIG. 4D are sequentially performed, in the third embodiment, immediately after the first film deposition step shown in FIG. 4C is performed, the step shown in FIG. 4E is performed without performing the second film deposition step shown in FIG. 4D.

Figure 10A:
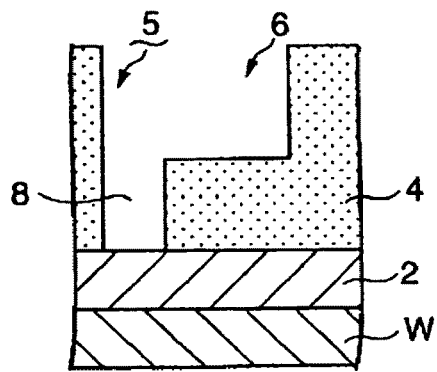
FIGS. 10A to 10F show a flowchart for explaining a method according to a third embodiment of the present invention.
Figure 10D:
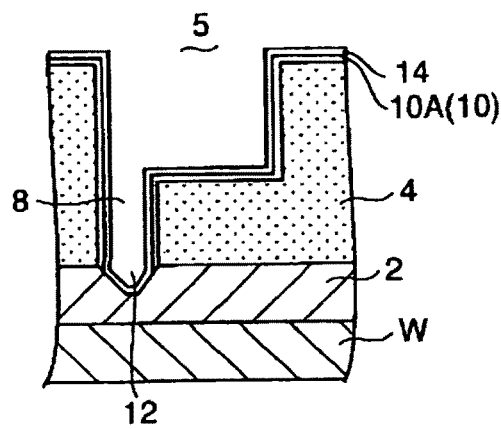
Figure 10B:
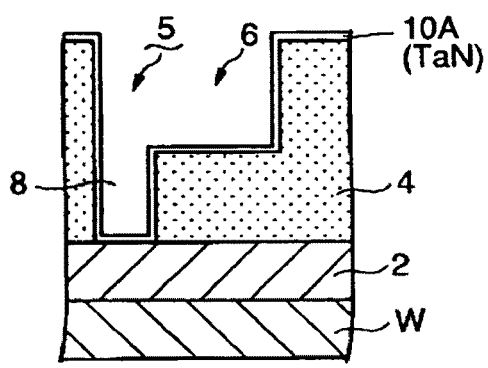
Figure 10E:
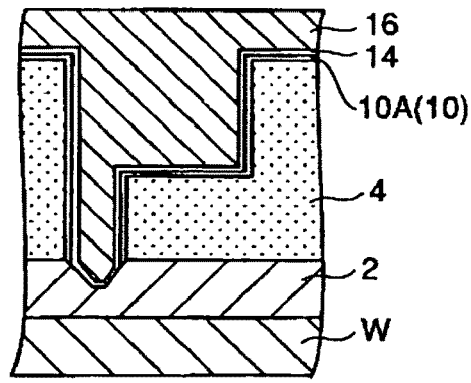
Figure 10C:
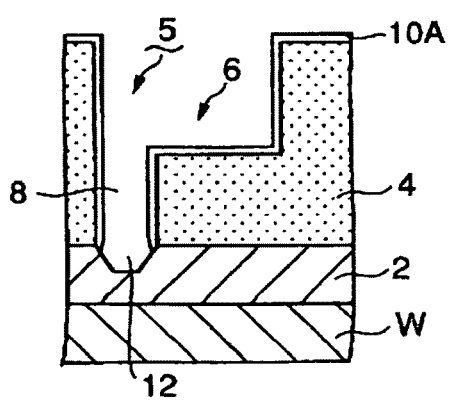
Figure 10F:
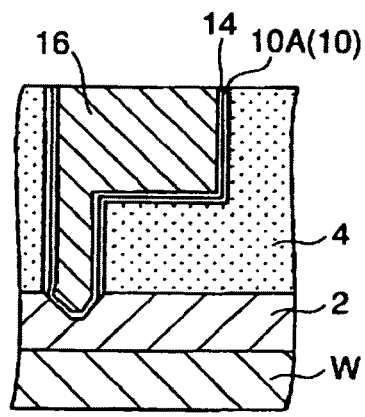

FIGS. 10A to 10F show a flowchart for explaining the method in the third embodiment of the present invention. In FIGS. 10A to 10F, the same elements as those shown in FIGS. 4A to 4G are shown by the same reference numbers. FIGS. 10A to 10C correspond to FIGS. 4A to 4C, respectively. FIGS. 10D to 10F correspond to FIGS. 4E to 4G, respectively.

In this embodiment, since a first film deposition step shown in FIG. 10C directly proceeds to a step of forming a seed film 14 shown in FIG. 10D, a barrier layer 10 is seemingly of a mono-layer structure including a base layer 10A formed of a TaN film. However, at the step shown in FIG. 10C, a very thin Ta film (not shown) is actually deposited on a sidewall of a trench 6 and/or on a sidewall of a communication hole 8. This is because, as shown in FIG. 2, while the sidewall is scarcely sputter-etched, Ta·Ta$^+$ are deposited on the sidewall although an amount thereof is very slight. Thus, in this embodiment, the barrier layer 10 is of a two-layered structure including the base film 10 formed of the TaN film and the Ta film (not shown) that is partially, slightly formed on the base film 10. Therefore, when a seed film 14 made of Cu is formed on the barrier layer 10 at the subsequent step, it is possible to maintain a tight contact (high adhesive properties) between the barrier layer 10 and the seed film 14.

In this embodiment, due to the omission of the second film deposition step shown in FIG. 4D, the process period can be shortened.

In the third embodiment, although the TaN film is used as the base film 10A, the present invention is not limited thereto. Alternatively, a Ta film may be used as the base film 10A which also serves as the barrier layer 10. In this case, the barrier layer 10 has a monolayer structure of the Ta film. When a seed film 14 made of Cu is formed on the barrier layer 10 formed of the Ta film at the subsequent step, it is possible to maintain a tight contact between the barrier layer 10 and the seed film 14.

In addition, the following manner may be employed as a fourth embodiment. That is, in the first embodiment, at the second film deposition step shown in FIG. 4D, the conditions are set such that, by setting a value of the bias electric power within the area A3 shown in FIG. 3, the amount of film deposition by metal particles is slightly larger than the amount of etching by the plasma of the inert gas. However, in the fourth embodiment; an auxiliary film deposition step is performed in which conditions are set such that metal ions are drawn as much as possible, by setting a value of the bias electric power within the area A1, in so far as substantially no etching by the plasma of the inert gas is performed.

FIGS. 11A to 11G show a flowchart for explaining the method in the fourth embodiment of the present invention.

Note that, since the film deposition rate in the area A1 is considerably larger than that in another area, it is preferable that the auxiliary film deposition step is performed for a very short time so as to reduce a film-thickness of a Ta film to be deposited as much as possible. Owing to the deposition of the Ta film under the conditions within the area A1, a little amount of the Ta film 10B is deposited not only on an upper surface of a wafer and a side surface of a recess but also on a bottom part of a scraped recess 12. In this case, the process period of this step is set such that a film thickness H2 of the film deposited on the bottom part of the scraped recess 12 is generally about 1 nm, or not more than 3 nm in maximum. The reason therefor is to reduce the thickness of the Ta film having a resistance larger than copper, in order to lower a resistance thereof while maintaining a tight contact between the Ta film and a lower layer.

Figure 11A:
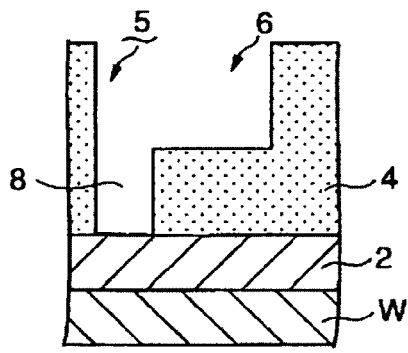
FIGS. 11A to 11G show a flowchart for explaining a method according to a fourth embodiment of the present invention.
Figure 11B:
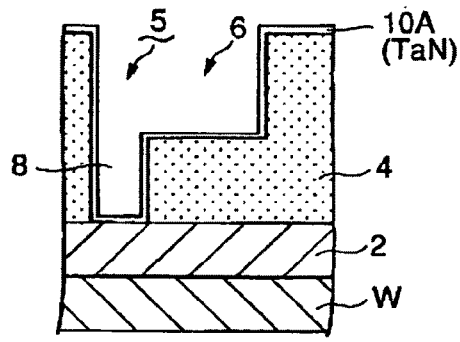
Figure 11C:
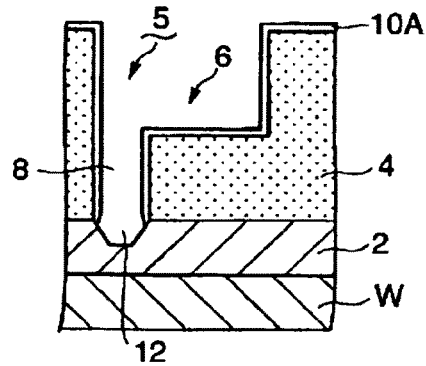
Figure 11D:
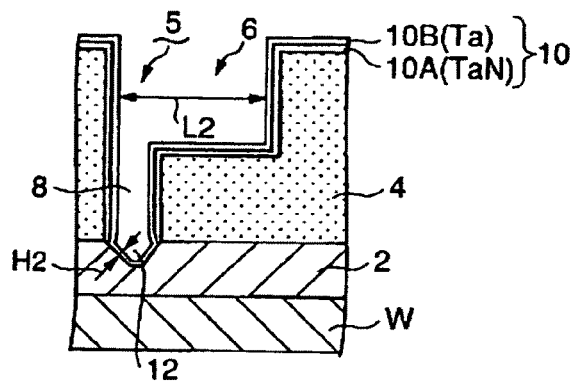
Figure 11E:
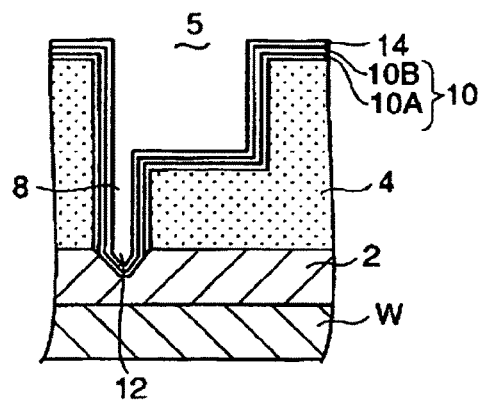
Figure 11F:
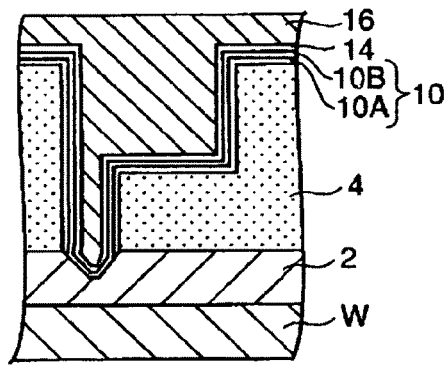
Figure 11G:
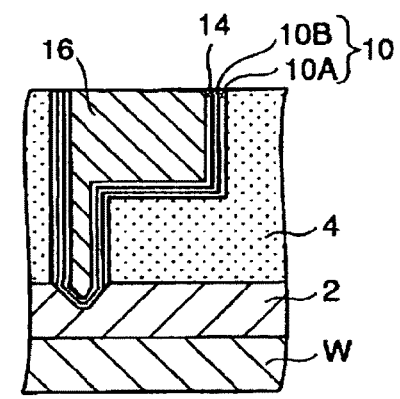

In the auxiliary film deposition step shown in FIG. 11D, since the area A1 shown in FIG. 3 is used as an operation point, a lower bias voltage is employed and thus drawing of ions is suppressed. Thus, the wafer surface is not sputtered, whereby the wafer is prevented from being damaged by sputtering.

As described above, since the film thickness H2 of the Ta film on the bottom part of the scraped recess 12 is about 1 nm (about 3 nm in maximum), adverse effects against electric resistance on this part can be restrained, and adhesive properties between the Ta film and the lower Cu layer can be hardly degraded to maintain the tight contact therebetween. In other words, since the thickness H2 of the Ta film is very thin, adhesive properties to a base copper wiring layer 2 can be improved, while an electric resistance of this part can be restrained.

In the respective embodiments, the communication hole 8 is formed in a part of the recess 5. That is, the recess 5 of a two-stepped shape has been described. However, the present invention is not limited thereto. For example, the present invention may be applied to a one-stepped recess, in which the recess 5 itself serves as the communication hole 8 such as a through hole and a via hole.

In addition, it goes without saying that the above numeric values in the respective embodiments are merely taken as examples, and that the present invention is not limited thereto. Furthermore, in the above respective embodiments, although as the layered structure of barrier layer/seed layer, there have been described the layered structures of TaN/Ta/Cu, and Ta/Ta/Cu, the present invention is not limited to the layered structures of this type. For example, the present invention may be naturally applied to a TiN/Ti/Cu layered structure, a TaN/Ru/Cu layered structure, a Ti/Cu layered structure, and moreover layered structures of TiN/Ti/Ru, Ti/Ru, TaN/Ru, and TaN/Ta/Ru.

The frequency of the radiofrequency power source is not limited to 13.56 MHz, and another frequency such as 27.0 MHz is possible. Not limited to an Ar gas, an inert gas for a plasma may be another inert gas, such as He and Ne.

Moreover, the semiconductor wafer has been described as an example of an object to be processed. However, not limited thereto, the present invention may be applied to an LCD substrate, a glass substrate, a ceramic substrate, and so on.

The invention claimed is:

1. A film deposition method of a metal film comprising the steps of:
    preparing an object to be processed having a recess formed in a surface thereof and having a wiring layer at a bottom part of the recess;
    forming a base layer on a surface of the object to be processed including a surface in the recess;
    ionizing a metal target in an evacuated processing vessel to generate metal particles including metal ions, by means of a plasma formed by making plasma an inert gas; and
    by applying a bias electric power to the object to be processed placed on a stage in the processing vessel to draw the plasma and the metal particles into the object to be processed, scraping the base layer and the wiring layer at the bottom part of the recess to form a scraped recess, and depositing a metal film on an entire surface of the object to be processed including the surface in the recess,
    wherein
    the step of scraping the base layer and the wiring layer and depositing the metal film includes:
    a first film deposition step in which conditions are set in such a manner that a film deposition amount of the metal film on the surface of the object to be processed excluding the recess is substantially equal to an etching amount by the plasma of the inert gas, so that the metal is not formed on the surface of the object to be processed and a scraped recess is formed on the base layer; and
    a second film deposition step in which conditions are set in such a manner that a film deposition amount of the metal film on the surface of the object to be processed excluding the recess is slightly larger than an etching amount by the plasma of the inert gas, so that a predetermined metal film is formed on the surface of the object to be processed excluding the recess and a concave shape of the scraped recess is further enlarged.

2. The film deposition method of a metal film according to claim 1, wherein
    conditions of the step of scraping the base layer and the wiring layer and depositing the metal film are set by controlling, at least, one or more of an electric power for making a plasma, a direct-current electric power to be applied to the metal target, and the bias electric power.

3. The film deposition method according to claim 2, wherein:
    the electric power for making a plasma is controlled within a range between 500-6000 watts;
    the direct-current electric power is controlled within a range between 100-12000 watts; and
    the bias electric power is controlled within a range between 100-2000 watts.

4. The film deposition method according to claim 1, wherein
    there is formed a barrier layer of a two-layered structure including the base film and the metal film.

5. The film deposition method according to claim 4, wherein
    the base film is a TaN film, and the metal film is a Ta film.

6. The film deposition method according to claim 4, wherein
    the base film is a Ta film, and
    the metal film is another Ta film to be deposited under film deposition conditions different from those of the base film.

7. The film deposition method according to claim 1, wherein
    the recess has a communication hole that will function as a via hole or a through hole, whereby the recess has a two-stepped shape.

8. The film deposition method according to claim 1, wherein
    the recess is a communication hole that will function as a via hole or a through hole.

9. A film deposition method of a metal film comprising the steps of:
    preparing an object to be processed having a recess formed in a surface thereof and having a wiring layer at a bottom part of the recess;
    forming a base layer on a surface of the object to be processed including a surface in the recess;

ionizing a metal target in an evacuated processing vessel to generate metal particles including metal ions, by means of a plasma formed by making plasma an inert gas; and by applying a bias electric power to the object to be processed placed on a stage in the processing vessel to draw the plasma and the metal particles into the object to be processed, scraping the base layer and the wiring layer at the bottom part of the recess to form a scraped recess, and depositing a metal film on an entire surface of the object to be processed including the surface in the recess, wherein the step of scraping the base layer and the wiring layer and depositing the metal film includes:

a first film deposition step in which conditions are set in such a manner that a film deposition amount of the metal film on the surface of the object to be processed excluding the recess is substantially equal to an etching amount by the plasma of the inert gas, so that the metal film is not formed on the surface of the object to be processed and a scraped recess is formed on the base layer; and an auxiliary film deposition step in which conditions are set in such a manner that the metal particles are drawn as much as possible in so far as the surface of the object to be processed excluding the recess is not etched by the plasma of the inert gas, so that a predetermined metal film is formed on the surface of the object to be processed including the recess.

* * * * *